(12) United States Patent
Katsumata et al.

(10) Patent No.: US 8,193,571 B2
(45) Date of Patent: Jun. 5, 2012

(54) STACKED TYPE NONVOLATILE SEMICONDUCTOR MEMORY DEVICE AND METHOD OF MANUFACTURING SAME

(75) Inventors: Ryota Katsumata, Kanagawa-ken (JP); Masaru Kito, Kanagawa-ken (JP); Yoshiaki Fukuzumi, Kanagawa-ken (JP); Masaru Kidoh, Tokyo (JP); Hiroyasu Tanaka, Tokyo (JP); Megumi Ishiduki, Kanagawa-ken (JP); Yosuke Komori, Kanagawa-ken (JP); Hideaki Aochi, Kanagawa-ken (JP); Yasuyuki Matsuoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 12/542,276

(22) Filed: Aug. 17, 2009

(65) Prior Publication Data

US 2010/0038699 A1 Feb. 18, 2010

(30) Foreign Application Priority Data

Aug. 18, 2008 (JP) ................................. 2008-210109

(51) Int. Cl.
*H01L 29/10* (2006.01)
*H01L 21/336* (2006.01)
(52) U.S. Cl. ... 257/302; 257/67; 257/315; 257/E21.614; 438/268
(58) Field of Classification Search .................. None
See application file for complete search history.

(56) References Cited

U.S. PATENT DOCUMENTS

| 6,727,544 | B2 | 4/2004 | Endoh et al. | |
|---|---|---|---|---|
| 6,870,215 | B2 | 3/2005 | Endoh et al. | |
| 2004/0132245 | A1* | 7/2004 | Juan | 438/243 |
| 2005/0153519 | A1* | 7/2005 | Lu et al. | 438/424 |
| 2007/0252201 | A1* | 11/2007 | Kito et al. | 257/331 |
| 2008/0244481 | A1* | 10/2008 | Kinoshita et al. | 716/5 |
| 2009/0294828 | A1* | 12/2009 | Ozawa et al. | 257/319 |
| 2009/0321813 | A1* | 12/2009 | Kidoh et al. | 257/324 |

FOREIGN PATENT DOCUMENTS

| JP | 2007-266143 | 10/2007 |
|---|---|---|
| KR | 10-0707217 | 4/2007 |
| KR | 10-2007-0096972 | 10/2007 |

OTHER PUBLICATIONS

Office Action issued Jul. 8, 2011 in Korean Patent Application No. 10-2011-50775 (with English translation).

* cited by examiner

*Primary Examiner* — N Drew Richards
*Assistant Examiner* — Peter Bradford
(74) *Attorney, Agent, or Firm* — Oblon, Spivak, McClelland, Maier & Neustadt, L.L.P.

(57) ABSTRACT

A stacked body is formed on a silicon substrate by stacking a plurality of insulating films and a plurality of electrode films alternately and through-holes are formed to extend in the stacking direction. Next, gaps are formed between the electrode films using etching the insulating films via the through-holes. Charge storage layers are formed along side faces of the through-holes and inner faces of the gaps, and silicon pillars are filled into the through-holes. Thereby, a nonvolatile semiconductor memory device is manufactured.

9 Claims, 17 Drawing Sheets

STACKED TYPE NONVOLATILE SEMICONDUCTOR MEMORY DEVICE AND METHOD OF MANUFACTURING SAME

CROSS-REFERENCE TO RELATED APPLICATIONS

This application is based upon and claims the benefit of priority from the prior Japanese Patent Application No. 2008-210109, filed on Aug. 18, 2008; the entire contents of which are incorporated herein by reference.

BACKGROUND OF THE INVENTION

1. Field of the Invention

The present invention relates to a nonvolatile semiconductor memory device and a method for manufacturing the same in which a plurality of insulating films and a plurality of electrode films are alternately stacked.

2. Background Art

Nonvolatile semiconductor memory devices of flash memory and the like conventionally are constructed by two-dimensionally integrating elements on a surface of a silicon substrate. In such a flash memory, the dimensions of each element must be reduced for downsizing to reduce the cost per bit and increase the memory capacity. However, such downsizing in recent years has become difficult in regard to both cost and technology.

Many ideas for three-dimensionally integrated elements are proposed as technology to breakthrough the limitations of increasing the integration. However, three-dimensional devices generally require at least three lithography steps for each layer. Therefore, the cost increases accompanying the increase of lithography steps unfortunately cancels the cost reductions gained by surface area reductions of the silicon substrate; and it is difficult to reduce costs even using three dimensions.

In consideration of such problems, the present inventors have proposed a one-mask patterned three-dimensional stacked memory (for example, refer to JP-A 2007-266143 (Kokai)). In such technology, a stacked body is formed on a silicon substrate by alternately stacking electrode films and insulating films, and then forming through-holes in the stacked body by one-mask patterning. A charge storage layer is formed on a side face of each through-hole, and silicon is filled into the through-hole to form a silicon pillar. A memory cell is thereby formed at an intersection between each electrode film and each silicon pillar.

In such a one-mask patterned three-dimensional stacked memory, charges can be pull out from the charge storage layer to the silicon pillar and charges can be put into the charge storage layer from the silicon pillar to record information by controlling an electrical potential of each electrode film and each silicon pillar. According to such technology, a plurality of electrode films are stacked on the silicon substrate. Thereby, the chip surface area per bit and the cost can be reduced. Moreover, the three-dimensional stacked memory can be constructed by one-mask patterning of the stacked body. Therefore, the number of lithography steps does not increase, and the cost can be prevented from increasing even in the case where the number of stacking increases.

SUMMARY OF THE INVENTION

According to an aspect of the invention, there is provided a nonvolatile semiconductor memory device including: a stacked body in which a plurality of insulating films and a plurality of electrode films are alternately stacked and a through-hole is formed to extend in the stacking direction; a semiconductor pillar filled into the through-hole; and a charge storage layer provided between the electrode film and the semiconductor pillar, a gap being formed between the electrode films to connect with the through-hole, and the charge storage layer being formed along an inner face of the gap.

According to another aspect of the invention, there is provided a method for manufacturing a nonvolatile semiconductor memory device, including: forming a stacked body by stacking a plurality of insulating films and a plurality of electrode films alternately; forming a through-hole in the stacked body to extend in a stacking direction; forming a gap between the electrode films by etching the insulating film via the through-hole; forming a charge storage layer along a side face of the through-hole and an inner face of the gap; and filling a semiconductor pillar into the through-hole.

DETAILED DESCRIPTION OF THE INVENTION

Embodiments of the present invention will be described with reference to the drawings.

First, a first embodiment of the present invention will be described.

Figure 1:
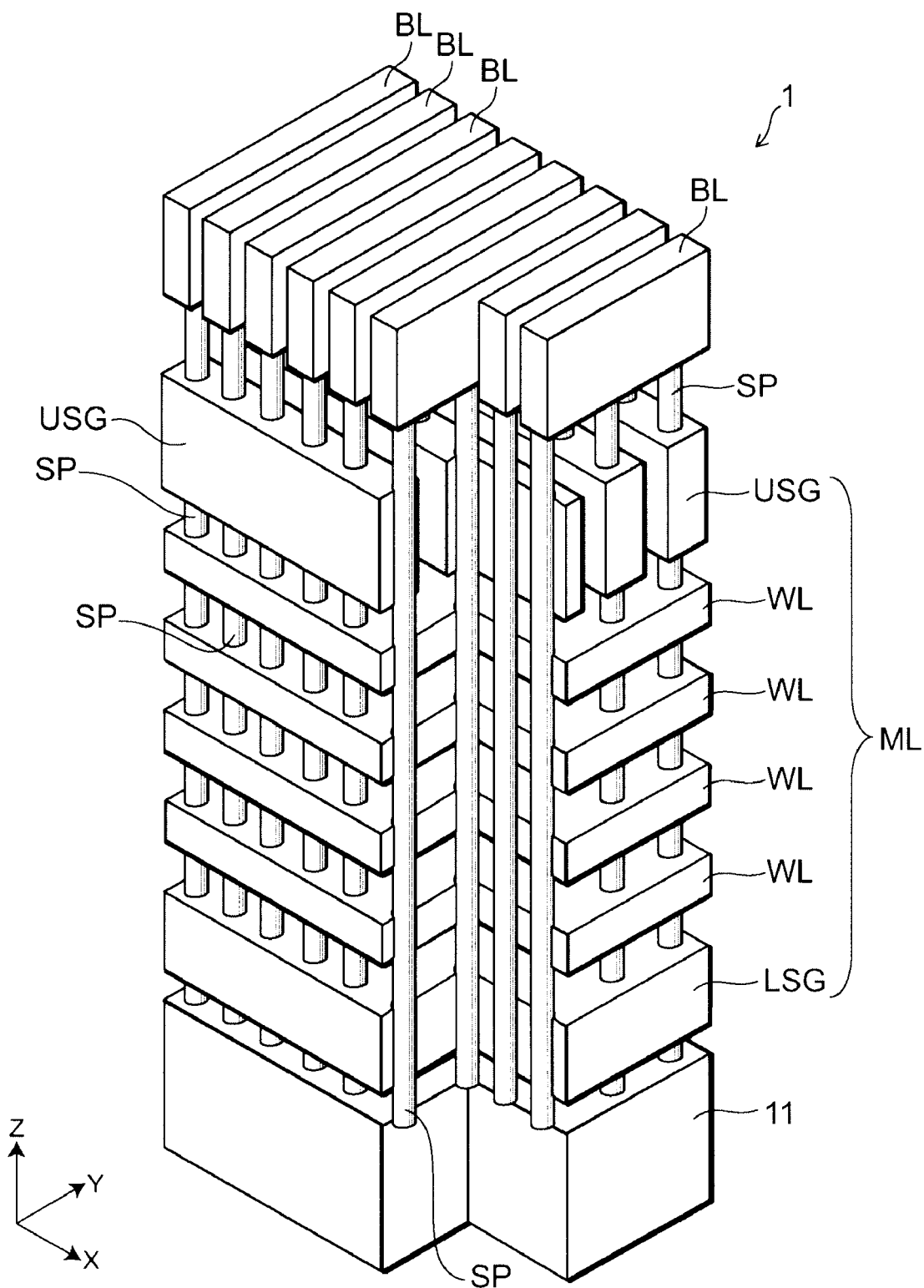
FIG. 1 is a perspective view illustrating a nonvolatile semiconductor memory device according to a first embodiment of the invention.

FIG. 1 is a perspective view illustrating a nonvolatile semiconductor memory device according to this embodiment.

Figure 2:
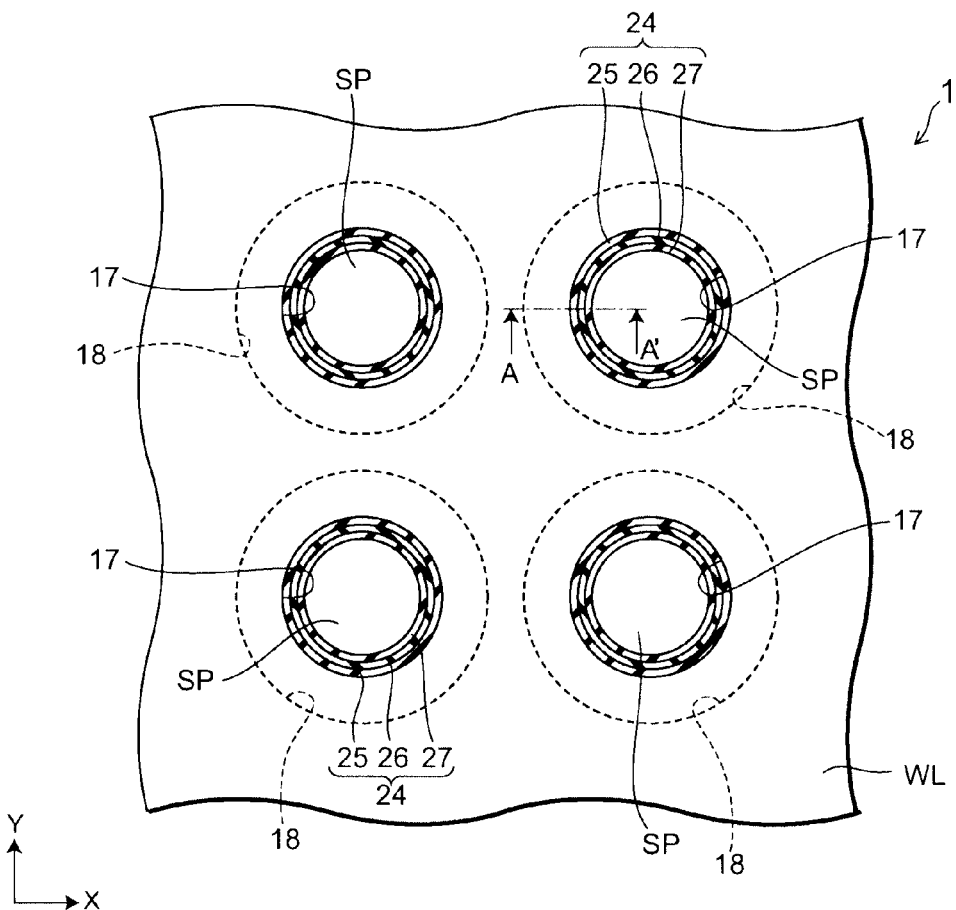
FIG. 2 is a plan view illustrating the nonvolatile semiconductor memory device according to the first embodiment.

FIG. 2 is a plan view illustrating the nonvolatile semiconductor memory device according to this embodiment.

Figure 3:
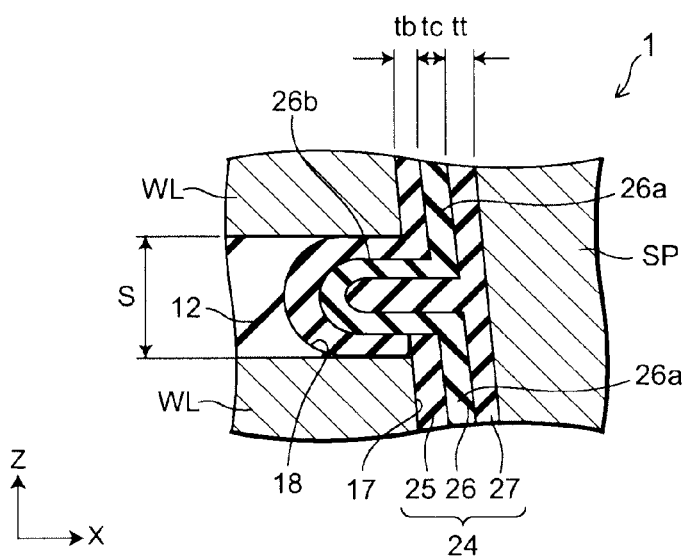
FIG. 3 is a cross-sectional view along line A-A' of FIG. 2.

FIG. 3 is a cross-sectional view along line A-A' of FIG. 2.

Only conductive portions are illustrated, and insulating portions are omitted in FIG. 1 for better clarity.

As illustrated in FIG. 1, a nonvolatile semiconductor memory device 1 according to this embodiment (hereinbelow also referred to as simply "device 1") is a three-dimensional stacked flash memory. A silicon substrate 11 formed of, for example, single crystal silicon, is provided in the device 1. A lower stacked gate body is provided on the silicon substrate 11 by stacking, in order, an insulating film (not illustrated), a lower select gate LSG, and an insulating film (not illustrated). The lower select gate LSG is formed of a conductive material such as, for example, poly silicon.

A stacked memory body is formed above the lower stacked gate body by alternately stacking a plurality of insulating films 12 (referring to FIG. 3) and a plurality of electrode films WL. The electrode film WL, for example, is formed of amorphous silicon having a P$^+$-type conductivity by introducing acceptor such as boron and the like, and functions as a word line. The insulating film 12 is formed of silicon oxide (SiO$_2$) and functions as an inter-layer insulating film that insulates the electrode films WL from each other. Although four layers of the electrode film WL are provided in the example illustrated in FIG. 1, the present invention is not limited thereto.

An upper stacked gate body is provided above the stacked memory body by stacking, in order, an insulating film (not illustrated), an upper select gate USG, and an insulating film (not illustrated). The upper select gate USG is formed of a conductive material such as, for example, amorphous silicon.

An XYZ orthogonal coordinate system is introduced in the present specification for convenience of description hereinbelow.

In this coordinate system, an X direction and a Y direction are assumed to be two mutually orthogonal directions parallel to an upper face of the silicon substrate 11; and a Z direction is assumed to be a direction orthogonal to both the X direction and the Y direction, that is, the stacking direction of the films described above.

The upper select gate USG is formed of one conductive film divided in the Y direction to form a plurality of conductive members having wire configurations extending in the X direction. Conversely, the electrode film WL and the lower select gate LSG are not divided; and each are formed of one conductive film parallel to the XY plane.

Then, a plurality of through-holes 17 (referring to FIG. 2 and FIG. 3) are formed in the lower stacked gate body, the stacked memory body, and the upper stacked gate body (hereinbelow generally referred to as "stacked body ML") to extend in the stacking direction (the Z direction). The configuration of the through-hole 17 has, for example, a circular columnar configuration. Each through-hole 17 passes through the entire stacked body ML. The through-holes 17 are arranged, for example, in a matrix configuration along the X direction and the Y direction.

A silicon pillar SP is filled into an interior of each through-hole 17 as a semiconductor pillar. The silicon pillar SP is formed of a semiconductor such as, for example, amorphous silicon doped with impurities. The configuration of the silicon pillar SP is a columnar configuration extending in the Z direction and has, for example, a circular columnar shape. The silicon pillar SP is provided over the entire length of the stacked body ML in the stacking direction. A lower end portion of the silicon pillar SP connects to the silicon substrate 11.

A plurality of bit lines BL are provided above the insulating film on the upper select gate USG to extend in the Y direction. The bit line BL is formed of a metal such as, for example, tungsten (W), aluminum (Al), or copper (Cu). In addition to pure metal, "metal" in the present specification includes alloys. Each bit line BL is disposed to pass through a region directly above each series of silicon pillars SP arranged along the Y direction, and connects to upper end portions of the silicon pillars SP. Thereby, the silicon pillars SP connect between the bit lines BL and the silicon substrate 11. Each bit line BL connects to a different series of the silicon pillars SP arranged along the Y direction.

As illustrated in FIG. 2 and FIG. 3, recessions and protrusions are formed on an inner side face of the through-hole 17. Regions of the inner side face formed of the insulating films 12 are at positions recessed from regions of the inner side face formed of the electrode films WL. In other words, the insulating films 12 are at positions more distal than the electrode films WL as viewed from the central axis of the through-hole 17. Thereby, a gap 18 which connects with the through-hole 17 is defined between the electrode films WL. The configuration of the gap 18 is a circular ring configuration enclosing the through-hole 17. Although each of the through-holes 17 formed in the stacked body ML includes the gap 18 defined between the electrode films WL, each gap 18 connects with only one through-hole 17. Restated, the gap 18 connecting with one through-hole 17 does not connect with another through-hole 17.

An ONO film (Oxide Nitride Oxide film) 24 is provided in a space having a substantially cylindrical configuration between a portion of the silicon pillar SP positioned in the stacked memory body (hereinbelow also referred to as "central portion of the silicon pillar") and the side face of the through-hole 17. In order from the outside, i.e., the electrode film WL side, an insulative block layer 25, a charge storage layer 26, and an insulative tunnel insulation layer 27 are stacked to form the ONO film 24. The block layer 25 is a layer in which current essentially does not flow even when a voltage in the range of a drive voltage of the device 1 is applied. The charge storage layer 26 is a layer capable of retaining a charge such as, for example, a layer including electron trap sites. Although the tunnel insulation layer 27 normally is insulative, the tunnel insulation layer 27 allows a tunnel current to flow when a prescribed voltage in the range of the drive voltage of the device 1 is applied. The block layer 25 contacts the insulating films 12 and the electrode films WL. The tunnel insulation layer 27 contacts the silicon pillar SP. The block layer 25 and the tunnel insulation layer 27 are formed of, for example, silicon oxide ($SiO_2$). The charge storage layer 26 is formed of, for example, silicon nitride (SiN).

The block layer 25, the charge storage layer 26, and the tunnel insulation layer 27 which form the ONO film 24 between the silicon pillar SP and the electrode films WL are formed in a mutually parallel layer configuration along the inner side face of the through-hole 17. In the gap 18, that is, between the silicon pillar SP and the insulating film 12, the block layer 25 and the charge storage layer 26 of the ONO film 24 are formed along an inner face of the gap 18 and are curved in a recessed configuration as viewed from the central axis of the through-hole 17. "Along the inner face" not only refers to the case where the charge storage layer 26 is provided parallel to the inner face of the gap 18, but also includes the case where the charge storage layer 26 extends away from the silicon pillar SP toward the interior of the gap 18 and then extends back toward the silicon pillar SP. The tunnel insulation layer 27 is formed to fill the gap 18. In other words, a portion of the tunnel insulation layer 27 between the silicon pillar SP and the insulating film 12 is thicker than a portion of the tunnel insulation layer 27 between the silicon pillar SP and the electrode film WL.

A length of the gap 18 in the Z direction, that is, a distance between the electrode films WL, satisfies Formula (1) below, where S is the distance between the electrode films WL, tb is a thickness of the block layer 25, tc is a thickness of the charge storage layer 26, and tt is a thickness of the tunnel insulation layer 27.

$$(tb+tc) \times 2 < S < (tb+tc+tt) \times 2 \qquad (1)$$

Making the distance S between the electrode films larger than twice the sum of the thickness tb of the block layer 25 and the thickness tc of the charge storage layer 26 enables the block layer 25 and the charge storage layer 26 to extend around inside the gap 18. On the other hand, making the distance S between the electrode films smaller than twice the sum of the thickness tb of the block layer 25, the thickness tc of the charge storage layer 26, and the thickness tt of the tunnel insulation layer 27 prevents the silicon pillar SP from entering into the gap 18.

An operation of this embodiment will now be described.

In the device 1 according to this embodiment, the central portion of the silicon pillar SP functions as channels; and the electrode films WL function as control gates. Thereby, an SGT (Surrounding Gate Transistor) which forms a memory cell is formed at each intersection of the silicon pillar SP and the electrode films WL. SGT refers to a transistor having a structure in which a gate electrode encloses a channel. Then, in each memory cell, electrons are trapped and stored in the electron traps in the charge storage layer 26; and information is thereby stored.

As a result, the same number of memory cells as electrode films WL is arranged in and around one silicon pillar SP in a series along the Z direction to form one memory string. A plurality of silicon pillars SP are arranged in the matrix configuration along the X direction and the Y direction. Thereby, a plurality of memory cells are three-dimensionally arranged along the X direction, the Y direction, and the Z direction in the stacked memory body.

In the device 1, an X coordinate of a memory cell is selected by selecting the bit line BL; a Y coordinate of the memory cell is selected by selecting the upper select gate USG to switch an upper portion of the silicon pillar SP to a conducting state or a non-conducting state; and a Z coordinate of the memory cell is selected by selecting the electrode film WL as the word line. Then, information is stored by implanting electrons into a portion 26a positioned in the charge storage layer 26 of the selected memory cell, that is, a portion disposed between the electrode film WL and the silicon pillar SP. The information stored in the memory cell is read by providing a sense current to the silicon pillar SP passing through the memory cell.

In such a case, a self-field formed by the electrons accumulated in the portion 26a corresponding to one memory cell applies a force on the electrons themselves in a direction away from the portion 26a. The force causes hopping conduction and the like and urges the electrons to diffuse. However, in the device 1, the gap 18 is defined between the electrode films WL; and the charge storage layer 26 is formed along the inner face of the gap 18. Therefore, the effective length of a portion 26b of the charge storage layer 26 disposed between the insulating film 12 and the silicon pillar SP is long in comparison to that of the case where the gap 18 is not made. In other words, although the portion 26b of the charge storage layer 26 is provided between the portions 26a which function as floating gates of the memory cells, the portion 26b is curved to detour around the shortest path between the portions 26a. Therefore, the effective distance between the portions 26a is long. As a result, the electrons implanted into the portion 26a corresponding to one electrode film WL are inhibited from diffusing via the portion 26b into a portion 26a corresponding to another electrode film WL adjacent to the one electrode film.

Effects of this embodiment will now be described.

In the nonvolatile semiconductor memory device 1 according to this embodiment as described above, the gap 18 is formed between the electrode films WL to connect with the through-hole 17; and the charge storage layer 26 is formed along the inner face of the gap 18. Therefore, the effective distance is long between the portions 26a of the charge storage layer 26 which store charges. Thereby, the diffusion distance is long for the charge implanted into one portion 26a to move to another portion 26a; and interference between adjacent memory cells is inhibited. Therefore, the reliability of data retained in the memory cell is high.

The size of the distance S between the electrode films WL in this embodiment is set to satisfy Formula (1) recited above. By making the distance S between the electrode films larger than twice the sum of the thickness tb of the block layer 25 and the thickness tc of the charge storage layer 26, the layout path of the block layer 25 and the charge storage layer 26 in the gap 18 can be provided to extend away from the silicon pillar SP and then extend back toward the silicon pillar SP. As a result, the portion 26b of the charge storage layer 26 can curve reliably along the inner face of the gap 18 to detour around the shortest path. On the other hand, the gap 18 is filled by only the ONO film 24 by making the distance S between the electrode films smaller than twice the sum of the thickness tb of the block layer 25, the thickness tc of the charge storage layer 26, and the thickness tt of the tunnel insulation layer 27; and the silicon pillar SP is prevented from entering into the gap 18. As a result, the implantation of charge into the portion 26b of the charge storage layer 26 can be prevented; and the reliability of data retention can be increased even more.

A comparative example of this embodiment will now be described.

Figure 4:
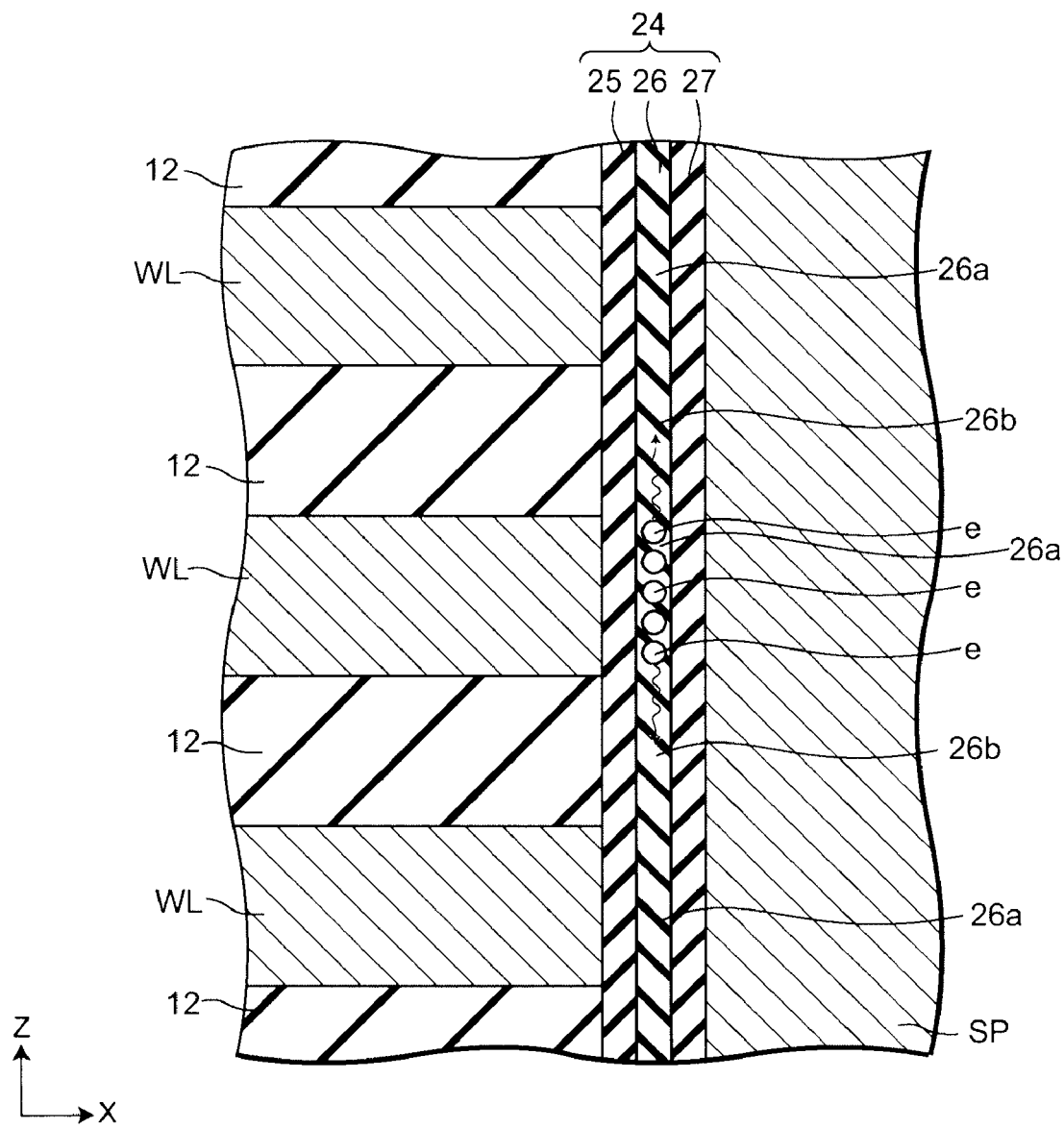
FIG. 4 is a cross-sectional view illustrating a nonvolatile semiconductor memory device according to a comparative example.

FIG. 4 is a cross-sectional view illustrating a nonvolatile semiconductor memory device according to this comparative example.

In this comparative example illustrated in FIG. 4, the gap 18 is not made between the electrode films WL. The inner face of the through-hole 17 has a straight-line configuration in a cross section parallel to the Z direction. Therefore, in this cross section, the charge storage layer 26 also is formed in a straight-line configuration; and the portion 26b is provided along the shortest path between the portions 26a.

As described above, a self-field formed by the electrons e accumulated in the portion 26a applies a force on the electrons e themselves in a direction away from the portion 26a, and the electrons e tend to scatter due to hopping conduction and the like. In this comparative example, the portion 26b of the charge storage layer 26 is formed in the shortest path between the portions 26a. Therefore, the electrons e accumulated in one portion 26a easily diffuse into a portion 26a adjacent thereto; and the reliability of the retained data is low.

A second embodiment of the present invention will now be described.

Figure 5:
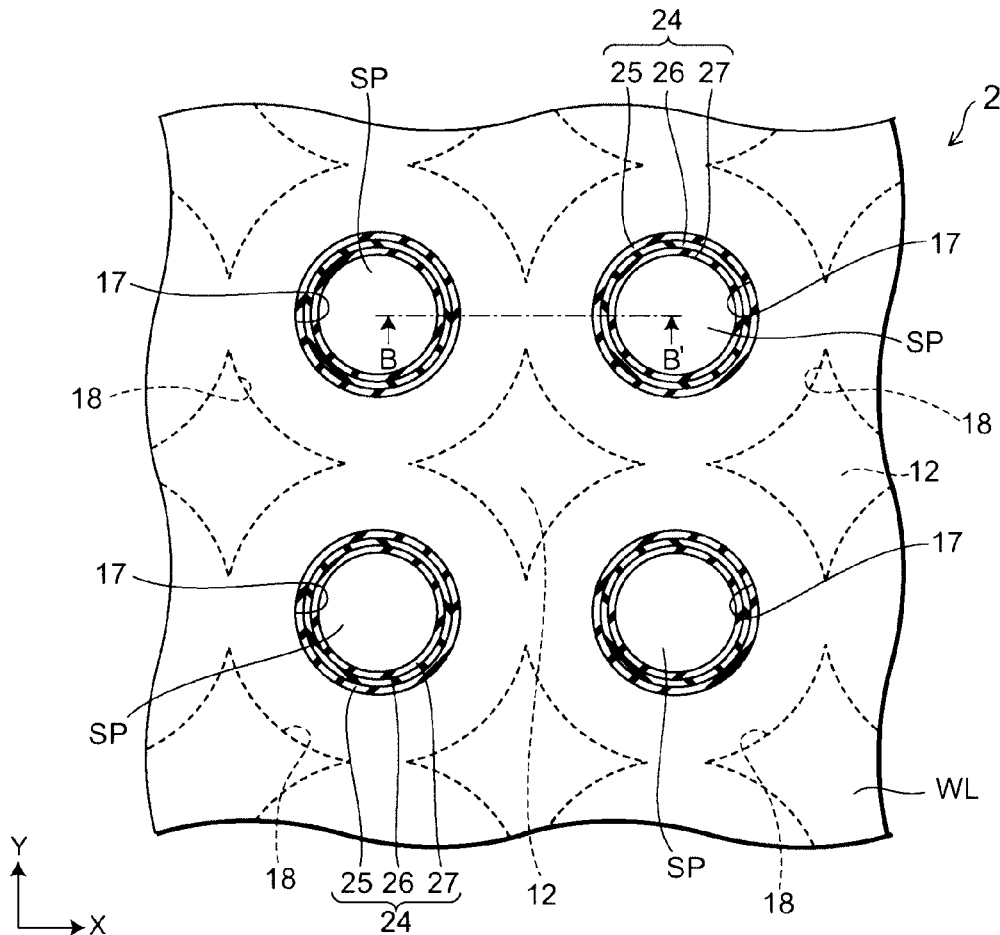
FIG. 5 is a plan view illustrating a nonvolatile semiconductor memory device according to a second embodiment of the invention.

FIG. 5 is a plan view illustrating a nonvolatile semiconductor memory device according to this embodiment.

Figure 6:
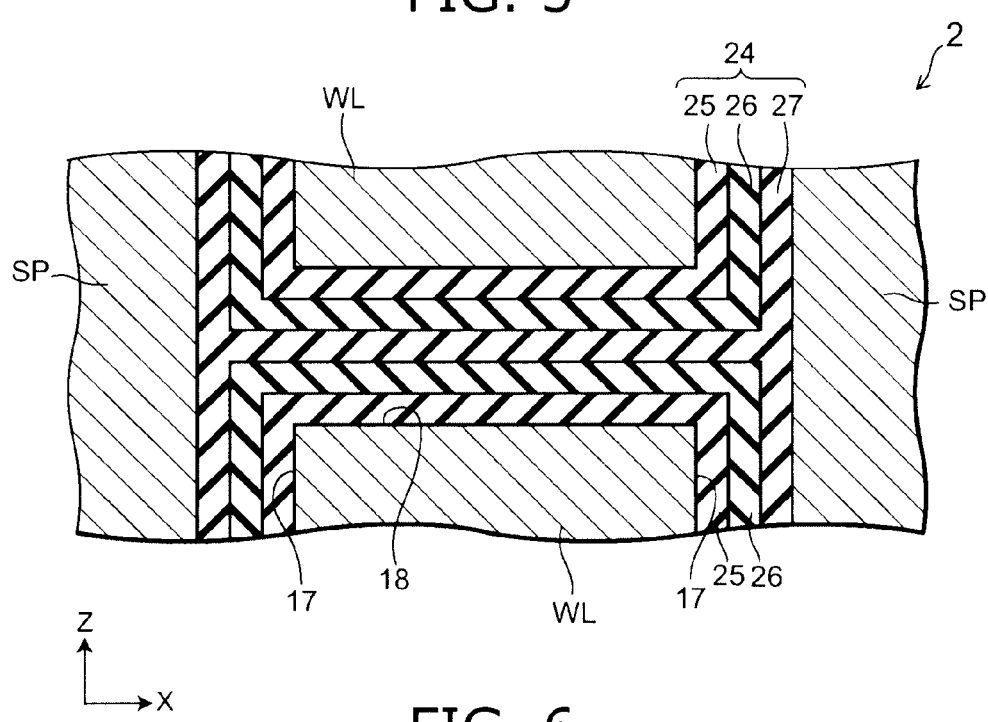
FIG. 6 is a cross-sectional view along line B-B' of FIG. 5.

FIG. 6 is a cross-sectional view along line B-B' of FIG. 5.

In a nonvolatile semiconductor memory device 2 according to this embodiment illustrated in FIG. 5 and FIG. 6, adjacent through-holes 17 connect with each other via the gap 18. The block layer 25 and the charge storage layer 26 are formed along an upper face and a lower face of the gap 18 and therefore are continuously formed between the adjacent through-holes 17. The length of the gap 18 in the Z direction, that is, the distance S between the electrode films WL satisfies Formula (1) recited above. Otherwise, the configuration of this embodiment is similar to the first embodiment described above.

In this embodiment, the gap 18 connecting with one through-hole 17 connects with the gap 18 connecting with a through-hole 17 adjacent thereto. Thereby, the portion 26a of the charge storage layer 26 corresponding to one memory cell can be effectively provided separately from the portion 26a corresponding to the memory cell directly below or the memory cell directly above the one memory cell. As a result, interference between memory cells adjacent in the Z direction can be reliably inhibited.

In this embodiment, the charge storage layers 26 are continuously formed between the through-holes 17. Therefore, interference between the memory cells formed in adjacent through-holes 17, that is, between the memory cells adjacent in the X direction or the Y direction poses a problem. However, the arrangement spacing of the through-holes 17 normally is larger than the lamination spacing of the electrode films WL. Accordingly, an arrangement period of the memory cells in the X direction and the Y direction is larger than an arrangement period of the memory cells in the Z direction. Therefore, interference between the memory cells in the X direction and the Y direction does not pose a problem as much as interference between the memory cells in the Z direction. Further, the distance between the through-holes 17 can be set to a value larger than a minimum patterning dimension in this case to reliably inhibit interference between memory cells arranged in the X direction and the Y direction. Otherwise, the operations and effects of this embodiment are similar to those of the first embodiment described above.

A third embodiment of the present invention will now be described.

Figure 7:
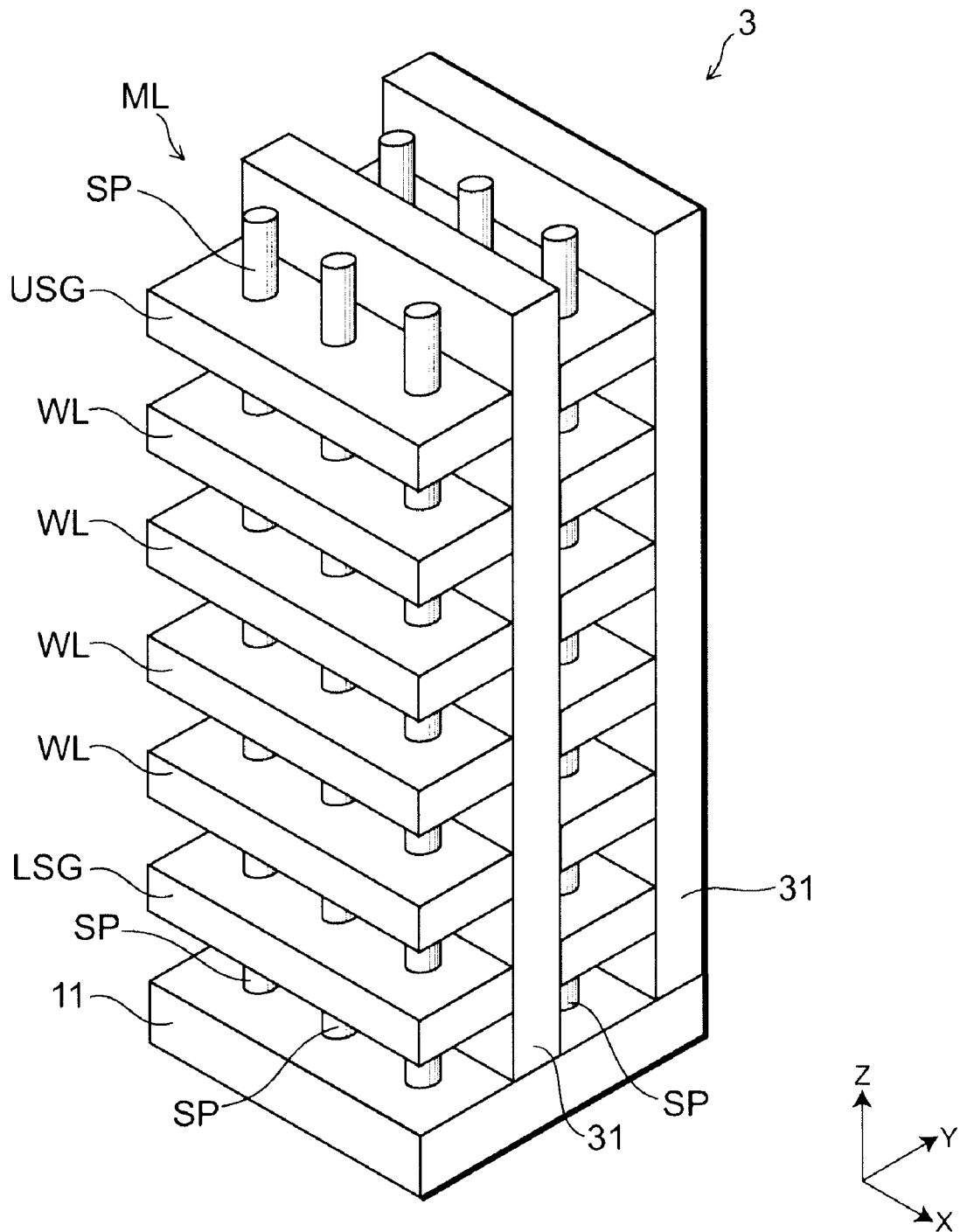
FIG. 7 is a perspective view illustrating a nonvolatile semiconductor memory device according to a third embodiment of the invention.

FIG. 7 is a perspective view illustrating a nonvolatile semiconductor memory device according to this embodiment.

Figure 8:
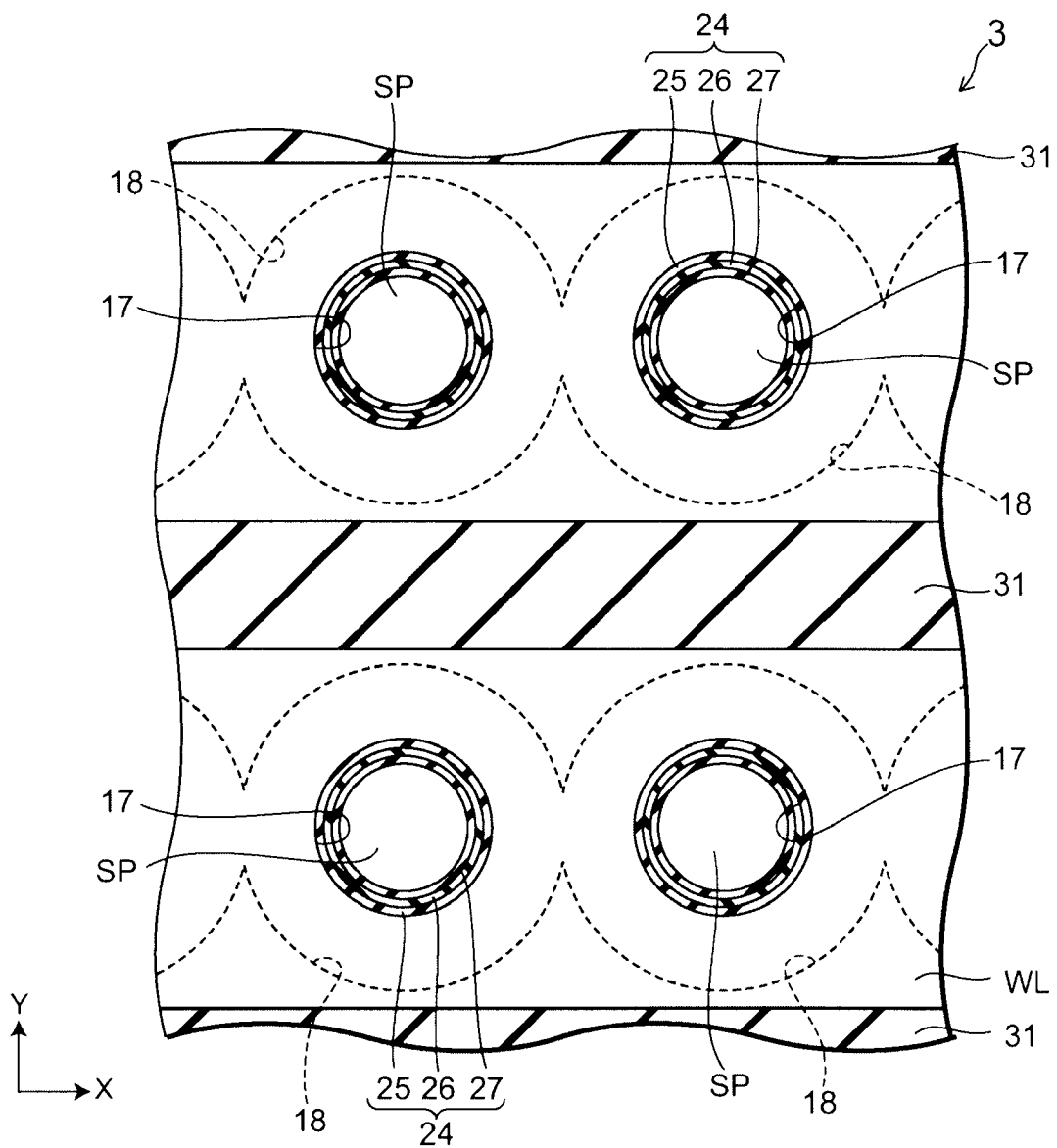
FIG. 8 is a plan view illustrating the nonvolatile semiconductor memory device according to the third embodiment.

FIG. 8 is a plan view illustrating the nonvolatile semiconductor memory device according to this embodiment.

In a nonvolatile semiconductor memory device 3 according to this embodiment illustrated in FIG. 7 and FIG. 8, the through-holes 17 adjacent in the X direction connect with each other via the gaps 18, while the through-holes 17 adjacent in the Y direction do not connect with each other. The stacked body ML is divided for each upper select gate USG in the Y direction. Accordingly, the electrode films WL, the insulating films 12, and the lower select gate LSG also are divided for each upper select gate USG; and each is formed by a plurality of portions extending in the X direction. In other words, each divided portion of the stacked body ML includes components such as one upper select gate USG; a plurality of, e.g., four, electrode films WL extending in the X direction; a plurality of insulating films 12; one lower select gate LSG extending in the X direction; and a plurality of silicon pillars SP arranged in one series along the X direction. Then, an insulating film 31 is filled between the portions of the stacked body ML. The gaps 18 do not reach the insulating film 31. Otherwise, the configuration of this embodiment is similar to that of the second embodiment described above.

According to this embodiment, the electrode films WL and the lower select gate LSG can be provided for each series of the silicon pillars SP arranged along the X direction. Thereby, the degrees of freedom for driving the device 3 increase. Although the stacked body ML is removed by one-mask patterning to form a groove configuration and provide space to fill the insulating film 31 during the manufacture of the device 3, the ONO film 24 does not extend into the patterning region of the stacked body ML at this time. The patterning is therefore easy. Otherwise, the operations and the effects of this embodiment are similar to those of the second embodiment described above.

A fourth embodiment of the present invention will now be described.

This embodiment illustrates a method for manufacturing a nonvolatile semiconductor memory device.

FIG. 9A to FIG. 19B are cross-sectional views of steps, illustrating the method for manufacturing the nonvolatile semiconductor memory device according to this embodiment.

Figure 9A:
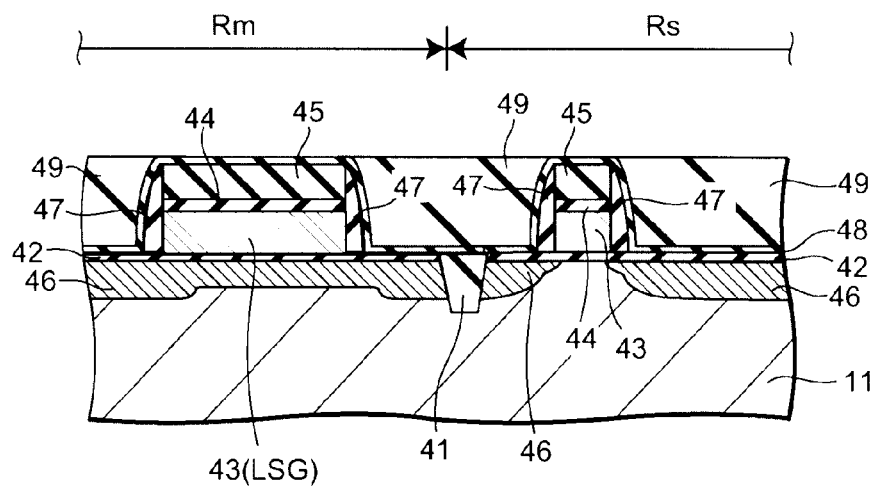
FIGS. 9A to 9C are cross-sectional views of steps, illustrating a method for manufacturing a nonvolatile semiconductor memory device according to a fourth embodiment of the invention.

First, as illustrated in FIG. 9A, an isolation film 41 is formed in an upper layer portion of the silicon substrate 11 in a boundary portion between a memory array region Rm and a peripheral region Rs. Then, a silicon oxide film 42 is formed on the entire upper face of the silicon substrate 11. A lower stacked gate body is then formed using depositing, in order, a poly silicon film 43, a silicon oxide film 44, and a cap SiN film 45. The lower stacked gate body is then patterned.

Impurities are then implanted using the lower stacked gate body as a mask to form a diffusion layer 46 in the upper layer portion of the silicon substrate 11. A spacer (side wall) 47 is formed on side faces of the lower stacked gate body using TEOS (Tetra-Ethoxy-Silane $(Si(OC_2H_5)_4)$. Then, a barrier SiN film 48 is formed on the entire surface. At this time, a transistor forming a peripheral circuit is formed in the peripheral region Rs. Then, an inter-layer insulating film 49 is deposited, and flattening processing is performed using the barrier SiN film 48 as a stopper. Thereby, the inter-layer insulating film 49 remains on the barrier SiN film 48 around and between the lower stacked gate body.

Figure 9B:
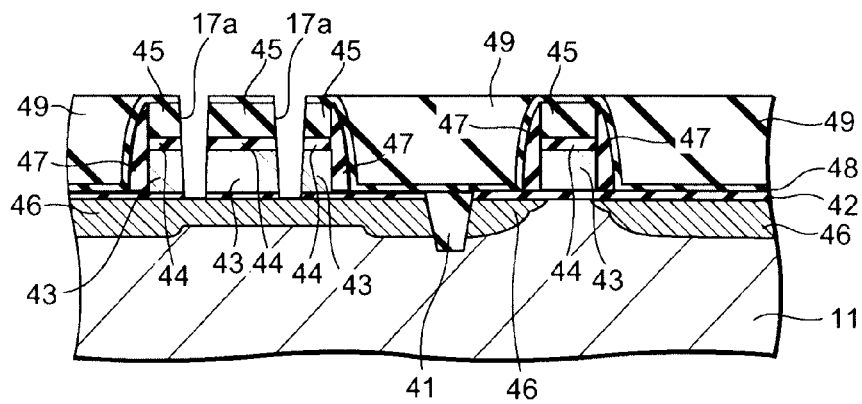

Continuing as illustrated in FIG. 9B, a resist (not illustrated) is applied. Lithography is then performed to pattern the resist film such that a plurality of apertures can be made in a matrix configuration. RIE (Reactive Ion Etching) is then performed using the resist pattern as a mask to selectively remove the barrier SiN film 48, the cap SiN film 45, the silicon oxide film 44, the poly silicon film 43, and the silicon oxide film 42 to make through-holes 17a which pass through the lower select gate LSG (the poly silicon film 43) to reach the silicon substrate 11. Phosphorus (P) is then ion-implanted via the through-hole 17a using conditions of, for example, an acceleration voltage of 10 keV and a dose amount of $5 \times 10^{15}$ $cm^{-2}$.

Figure 9C:
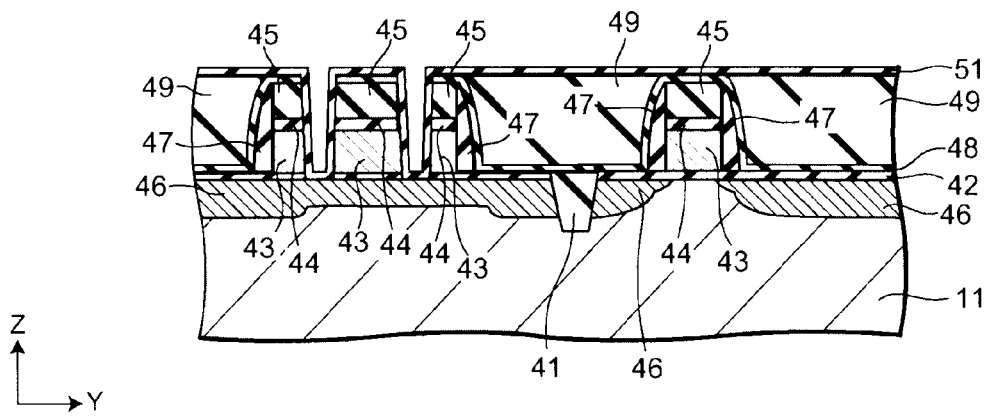

Continuing as illustrated in FIG. 9C, a silicon oxide film is formed with a thickness of, for example, 10 nm by LP-CVD (Low Pressure Chemical Vapor Deposition). Thereby, a gate insulation film 51 is formed on the upper faces of the lower stacked gate body and the inter-layer insulating film 49 and on an inner face of the through-hole 17a.

Figure 10A:
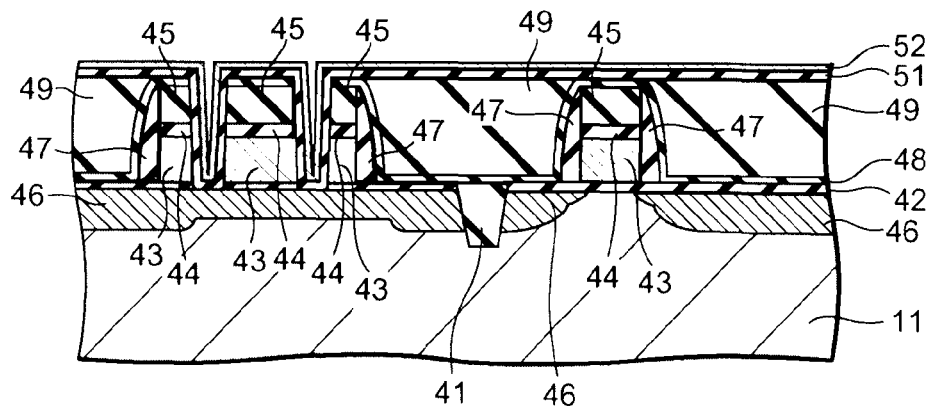
FIGS. 10A to 10C are cross-sectional views of steps, illustrating the method for manufacturing the nonvolatile semiconductor memory device according to the fourth embodiment.

As illustrated in FIG. 10A, amorphous silicon is then deposited on the entire surface with a thickness of, for example, 15 nm. Thereby, an amorphous silicon film 52 is formed on the gate insulation film 51.

Figure 10B:
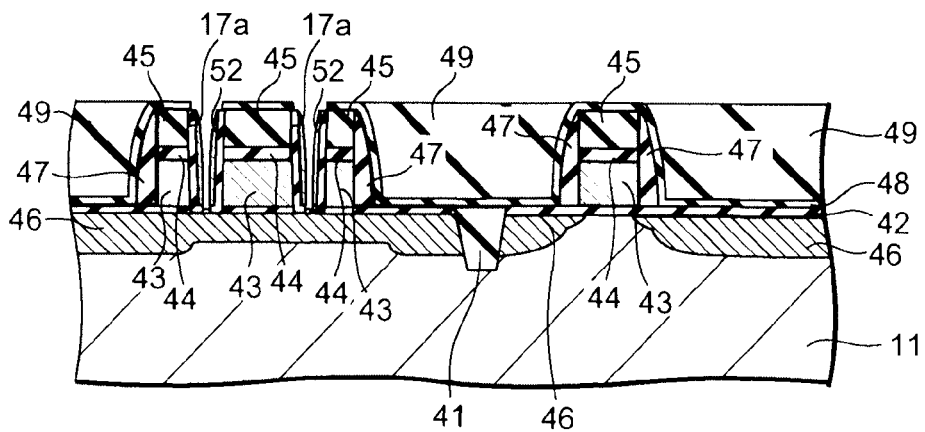

Then, as illustrated in FIG. 10B, RIE is performed to remove the amorphous silicon film 52 from the upper faces of the lower stacked gate body and the inter-layer insulating film 49 and from a bottom face of the through-hole 17a. Thereby, the amorphous silicon film 52 remains only on the side face of the through-hole 17a and is fashioned into a spacer configuration having a thin upper portion and a thick lower portion. Etching is then performed using the patterned amorphous silicon film 52 as a mask to remove the gate insulation film 51 from the upper faces of the lower stacked gate body and the inter-layer insulating film 49 and from the bottom face of the through-hole 17a. Thereby, the silicon substrate 11 is exposed at the bottom face of the through-hole 17a.

Figure 10C:
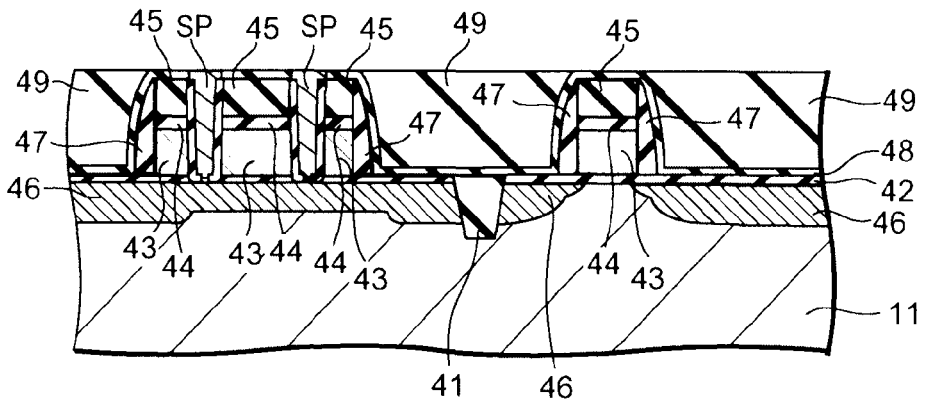

As illustrated in FIG. 10C, amorphous silicon is again deposited and flattened by performing CMP (chemical mechanical polishing) using the barrier SiN film 48 as a stopper. Thereby, a lower portion of the silicon pillar SP formed of amorphous silicon is filled into the interior of the through-hole 17a. Phosphorus (P) is then ion-implanted using, for example, acceleration voltages of 220 keV, 250 keV, and 280 keV and a dose amount of $5 \times 10^{11}$ $cm^{-2}$. Then, arsenic (As) is ion-implanted using an acceleration voltage of 40 keV and a dose amount of $3 \times 10^{15}$ $cm^{-2}$. Thereby, a drain diffusion layer (not illustrated) is formed on the silicon pillar SP. RTA (Rapid Thermal Anneal) is then performed, for example, at a temperature of 960° C. for ten seconds to activate the implanted impurities. Thereby, the poly silicon film 43 in the memory array region Rm forms the lower select gate LSG; and a lower portion select transistor is formed.

Figure 11A:
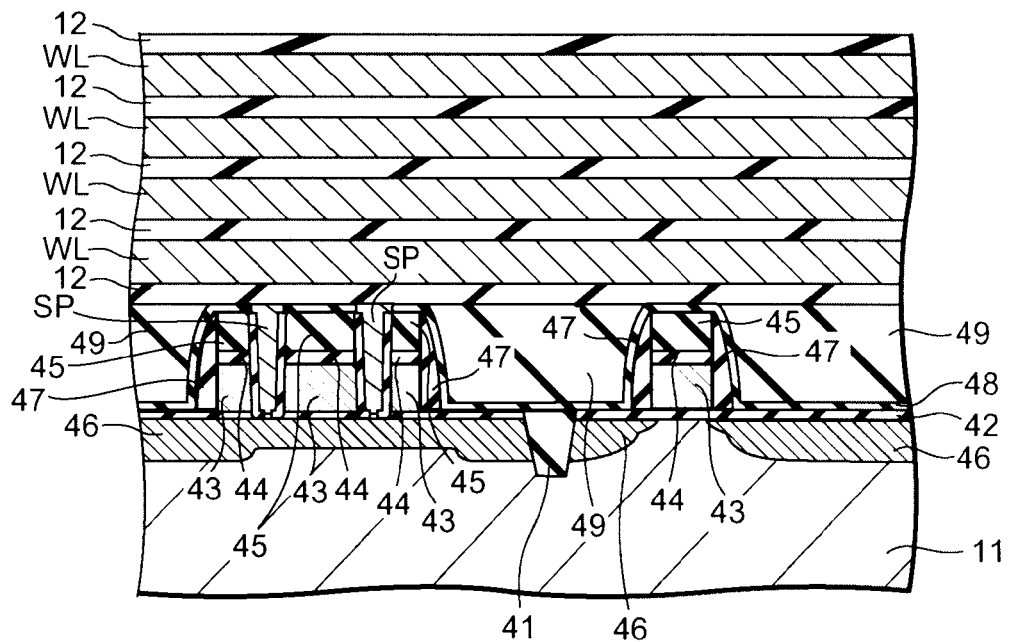
FIGS. 11A and 11B are cross-sectional views of steps, illustrating the method for manufacturing the nonvolatile semiconductor memory device according to the fourth embodiment.

Continuing as illustrated in FIG. 11A, a stopper silicon nitride film (not illustrated) and then the insulating film 12 formed of silicon oxide are formed on the entire surface. Amorphous silicon and silicon oxide are then alternately deposited, thereby constructing a stacked memory body in which the electrode film WL formed of the amorphous silicon and the insulating film 12 formed of the silicon oxide are alternately stacked.

Figure 11B:
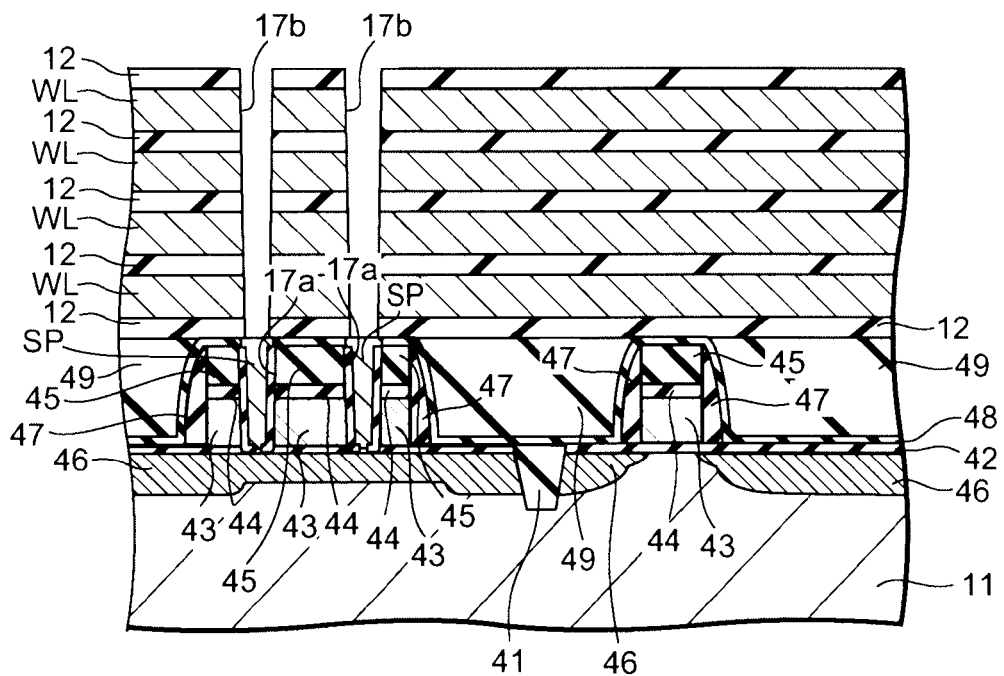
Figure 12A:
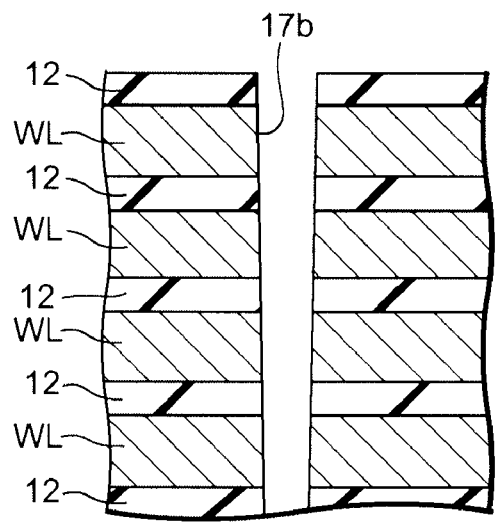
FIGS. 12A and 12B are cross-sectional views of steps, illustrating the method for manufacturing the nonvolatile semiconductor memory device according to the fourth embodiment.

As illustrated in FIG. 11B, a resist pattern (not illustrated) is formed by lithography such that a plurality of apertures can be formed in a matrix configuration. At this time, each aperture is positioned in a region directly above the through-hole 17a formed in the lower select gate LSG. Then, RIE is performed using the resist pattern as a mask to make through-holes 17b in the stacked memory body formed of the electrode films WL and the insulating films 12. Thereby, each through-hole 17b connects with each through-hole 17a; and the upper face of the lower portion of the silicon pillar SP is exposed at a bottom face of the through-hole 17b. At this stage, the side face of the through-hole 17b has a straight-line configuration slightly inclined with respect to the Z direction in a cross section parallel to the stacking direction as illustrated in FIG. 12A.

Figure 12B:
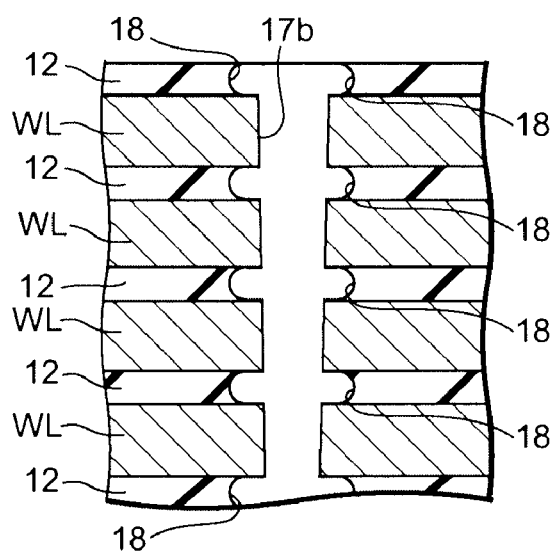

Then, as illustrated in FIG. 12B, wet etching is performed via the through-hole 17b using, for example, an etchant including hydrogen fluoride such as, for example, dilute hydrofluoric acid to remove portions of the insulating films 12 exposed on the side face of the through-hole 17b. Thereby, the insulating films 12 are recessed between the electrode films WL to form the gaps 18. At this time, the gaps 18 are formed in circular ring configurations around each through-hole 17b and do not connect with other through-holes 17b.

Figure 13A:
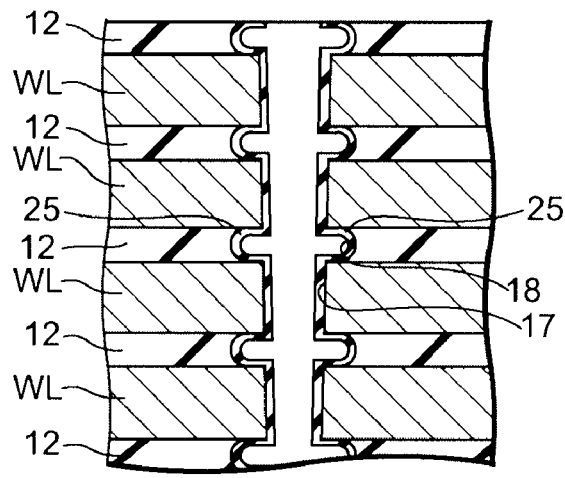
FIGS. 13A and 13B are cross-sectional views of steps, illustrating the method for manufacturing the nonvolatile semiconductor memory device according to the fourth embodiment.

Continuing as illustrated in FIG. 13A, silicon oxide is deposited. Thereby, the block layer 25 formed of the silicon oxide is formed on the inner face of the through-hole 17b and the inner face of the gap 18. At this time, the block layer 25 is formed along the inner face of the gap 18 to curve in a recessed configuration as viewed from the central axis of the through-hole 17b.

Figure 13B:
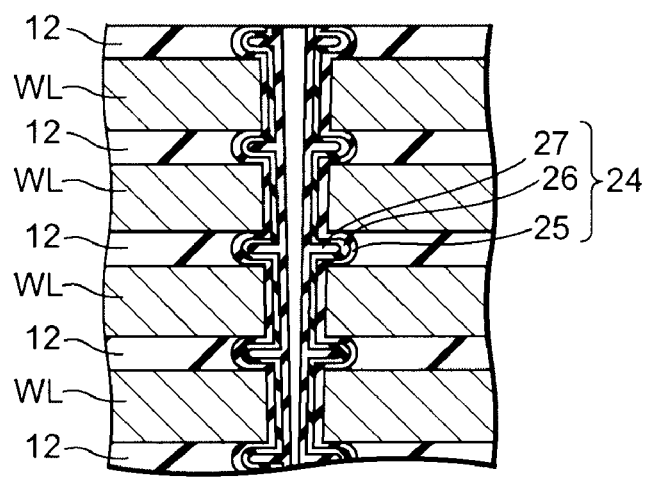

As illustrated in FIG. 13B, silicon nitride is then deposited. The charge storage layer 26 formed of the silicon nitride is thereby formed on the block layer 25. Here, the relationship of the thickness tb of the block layer 25 and the thickness tc of the charge storage layer 26 to the distance S between the electrode films WL is set to satisfy Formula (2) below; and thereby, the charge storage layer 26 is formed along the inner face of the gap 18 to curve in a recessed configuration as viewed from the central axis of the through-hole 17b.

$$(tb+tc) \times 2 < S \qquad (2)$$

Silicon oxide is then deposited. Thereby, the tunnel insulation layer 27 formed of the silicon oxide is formed on the charge storage layer 26. In such a case, the relationship of the thickness tt of the tunnel insulation layer 27, the thickness tb of the block layer 25, and the thickness tc of the charge storage layer 26 to the distance S between the electrode films WL is set to satisfy Formula (3) below; and thereby, the tunnel insulation layer 27 fills a portion of the interior of the gap 18 not filled by the block layer 25 and the charge storage layer 26. As a result, the surface of the tunnel insulation layer 27 is substantially flat as viewed from the central axis of the through-hole 17.

$$S < (tb+tc+tt) \times 2 \qquad (3)$$

Combining Formulas (2) and (3) recited above gives Formula (1) recited above. The ONO film 24 is formed of the block layer 25, the charge storage layer 26, and the tunnel insulation layer 27.

Figure 14A:
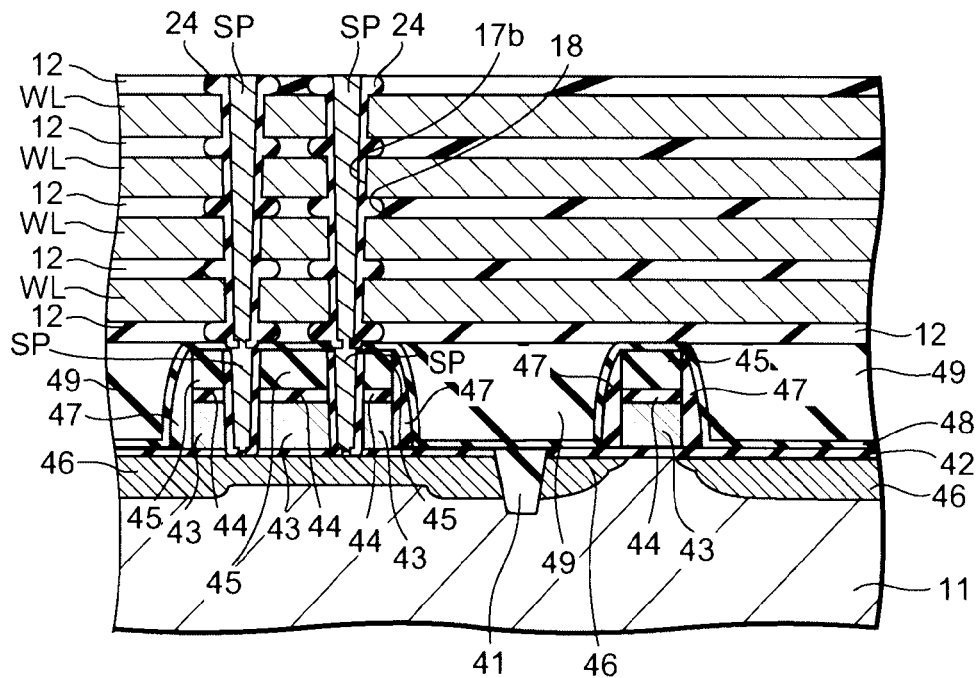
FIGS. 14A and 14B are cross-sectional views of steps, illustrating the method for manufacturing the nonvolatile semiconductor memory device according to the fourth embodiment.

Continuing as illustrated in FIG. 14A, amorphous silicon is deposited and then flattened. The central portion of the silicon pillar SP is thereby filled into the interior of the through-hole 17b. Arsenic (As) is then ion-implanted by, for example, an acceleration voltage of 40 keV and a dose amount of $5 \times 10^{15}$ $cm^{-2}$. A drain diffusion layer (not illustrated) is thereby formed on the silicon pillar SP. RTA is then performed, for example, at a temperature of 960° C. for ten seconds to activate the implanted impurities.

Figure 14B:
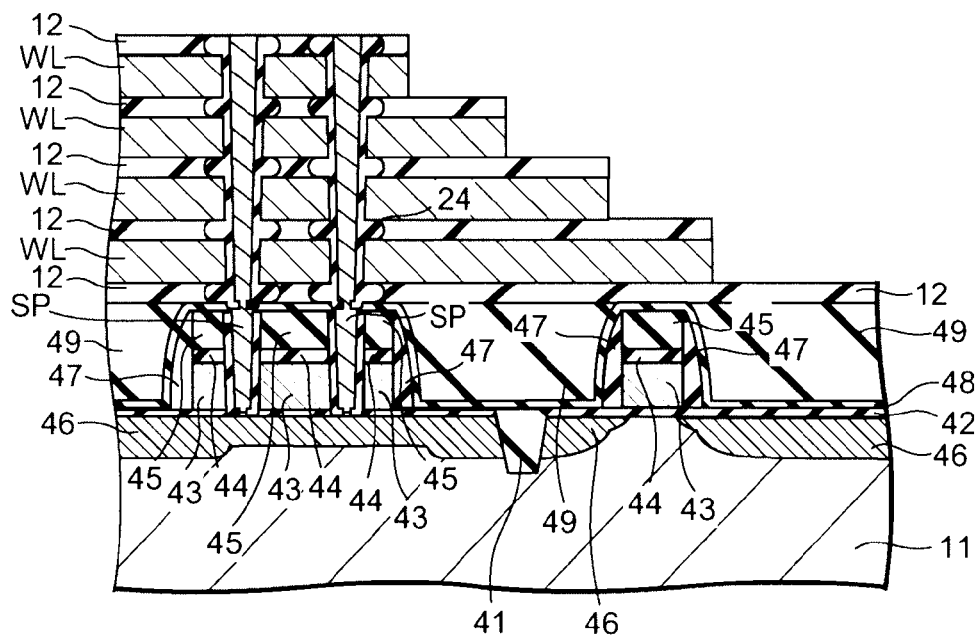

Then, as illustrated in FIG. 14B, a resist film (not illustrated) is formed with a thickness of, for example, 3 μm by a coating method and then patterned. At this time, the configuration of the resist film is the patterned configuration of the lowermost layer of the electrode films WL. An end portion of the stacked memory body formed by the electrode films WL and the insulating films 12 is patterned into a stair-step configuration by alternately repeating a step that performs RIE using the resist film as a mask to pattern one layer of each of the insulating film 12 and the electrode film WL and a step that performs an ashing of the resist film for sliming the profile thereof.

Figure 15A:
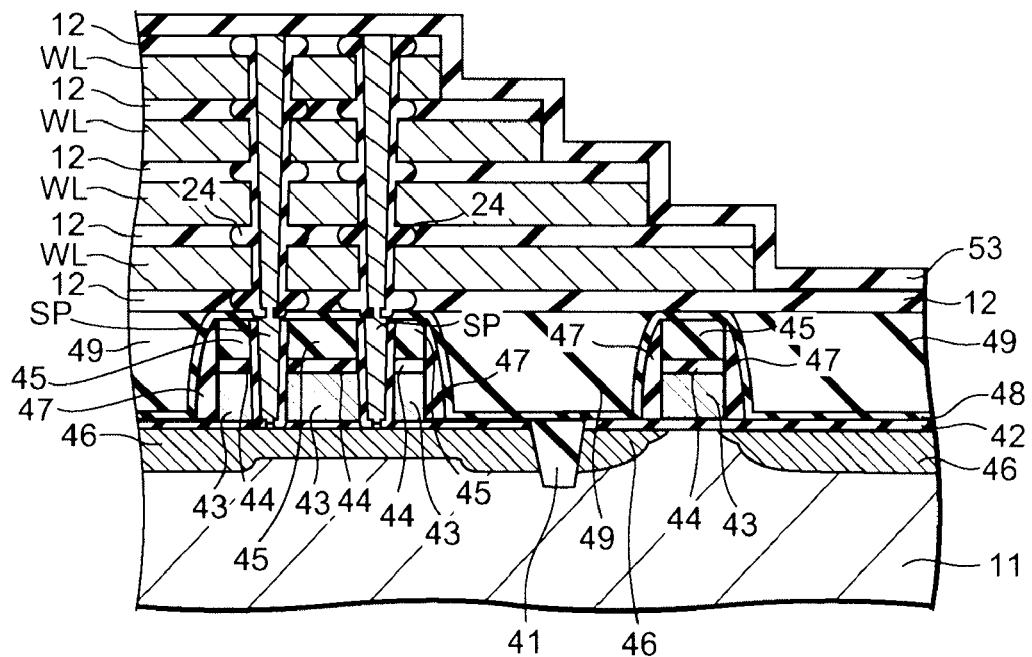
FIGS. 15A and 15B are cross-sectional views of steps, illustrating the method for manufacturing the nonvolatile semiconductor memory device according to the fourth embodiment.

As illustrated in FIG. 15A, a stopper silicon nitride film 53 is then formed on the entire surface by depositing, for example, silicon nitride (SiN).

Figure 15B:
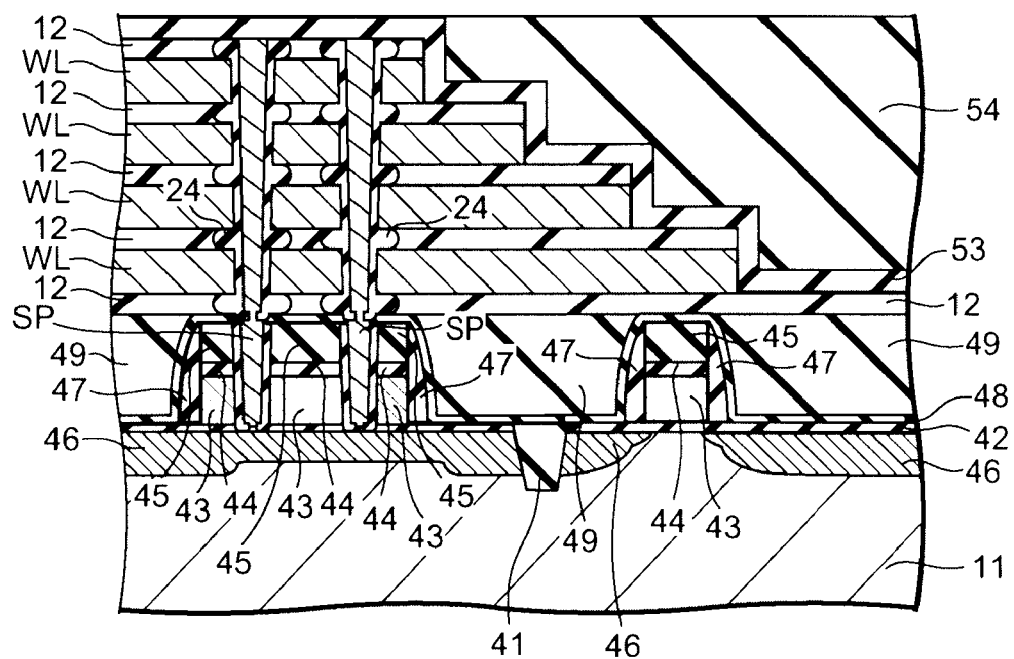

Continuing as illustrated in FIG. 15B, BPSG (Boro-Phospho Silicate Glass), for example, is deposited on the entire surface of the stopper silicon nitride film 53. CMP is then performed using the stopper silicon nitride film 53 as a stopper to form an inter-layer insulating film 54.

Figure 16A:
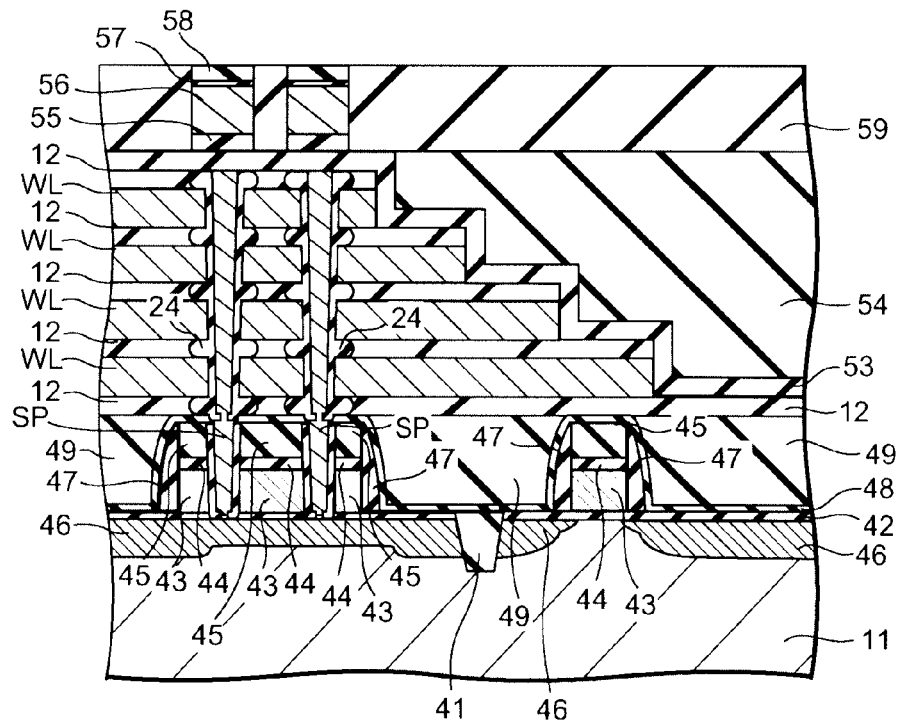
FIGS. 16A and 16B are cross-sectional views of steps, illustrating the method for manufacturing the nonvolatile semiconductor memory device according to the fourth embodiment.

Then, as illustrated in FIG. 16A, an upper stacked gate body is formed in a region directly above the uppermost layer of the electrode films WL by depositing, in order, a silicon oxide film 55, a poly silicon film 56, a TEOS film 57, and a silicon nitride film 58. The upper stacked gate body is then patterned into a line configuration. An inter-layer insulating film 59 is then formed around the upper stacked gate body.

Figure 16B:
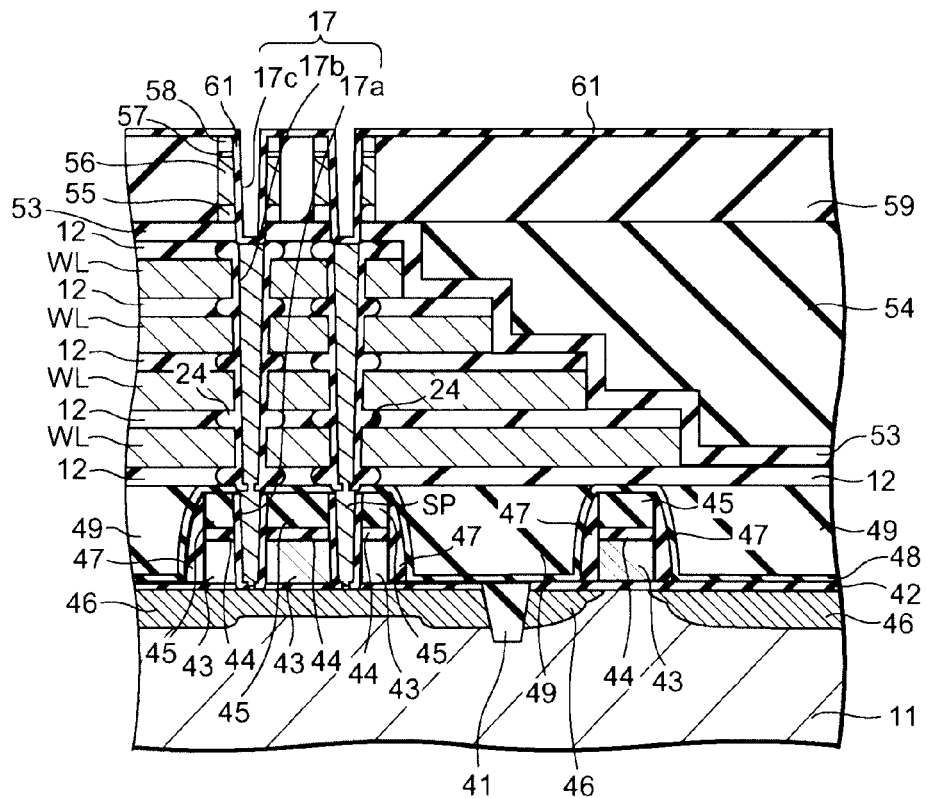

As illustrated in FIG. 16B, through-holes 17c are formed using etching the silicon nitride film 58, the TEOS film 57, the poly silicon film 56, the silicon oxide film 55, and the stopper silicon nitride film 53. At this time, each of the through-holes 17c is formed in a region directly above each through-hole 17b. The through-holes 17a, 17b, and 17c thereby mutually connect to define the through-hole 17 continuously extending in the Z direction. A silicon oxide film is then deposited with a thickness of, for example, 10 nm, by LP-CVD to form a gate insulation film 61.

Figure 17A:
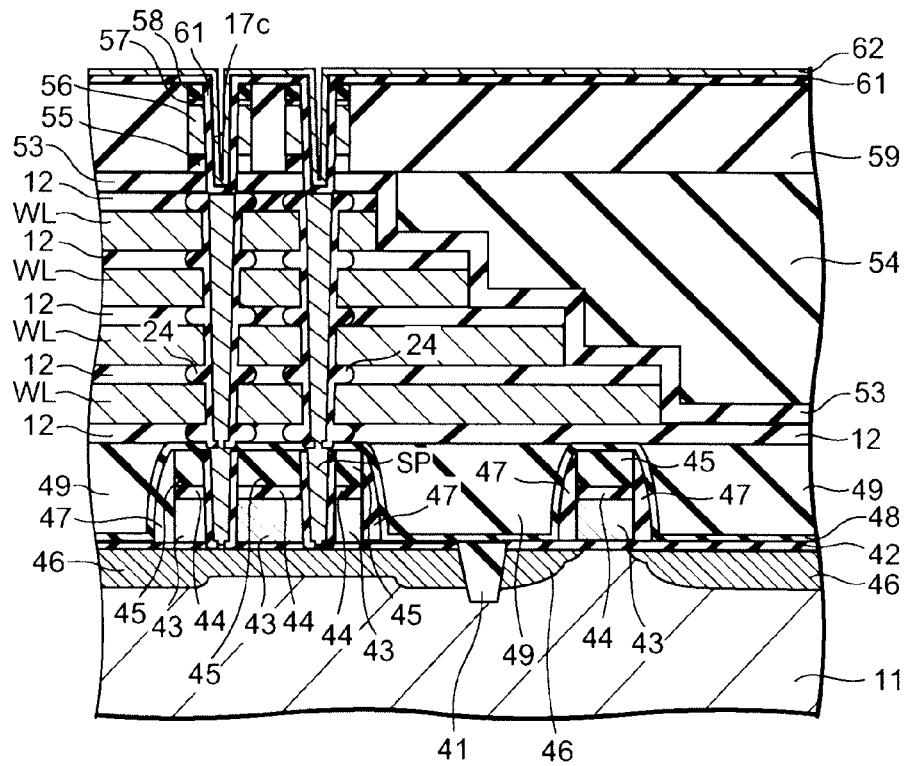
FIGS. 17A and 17B are cross-sectional views of steps, illustrating the method for manufacturing the nonvolatile semiconductor memory device according to the fourth embodiment.

Continuing as illustrated in FIG. 17A, amorphous silicon is deposited on the entire surface with a thickness of, for example, 15 nm to form an amorphous silicon film 62.

Figure 17B:
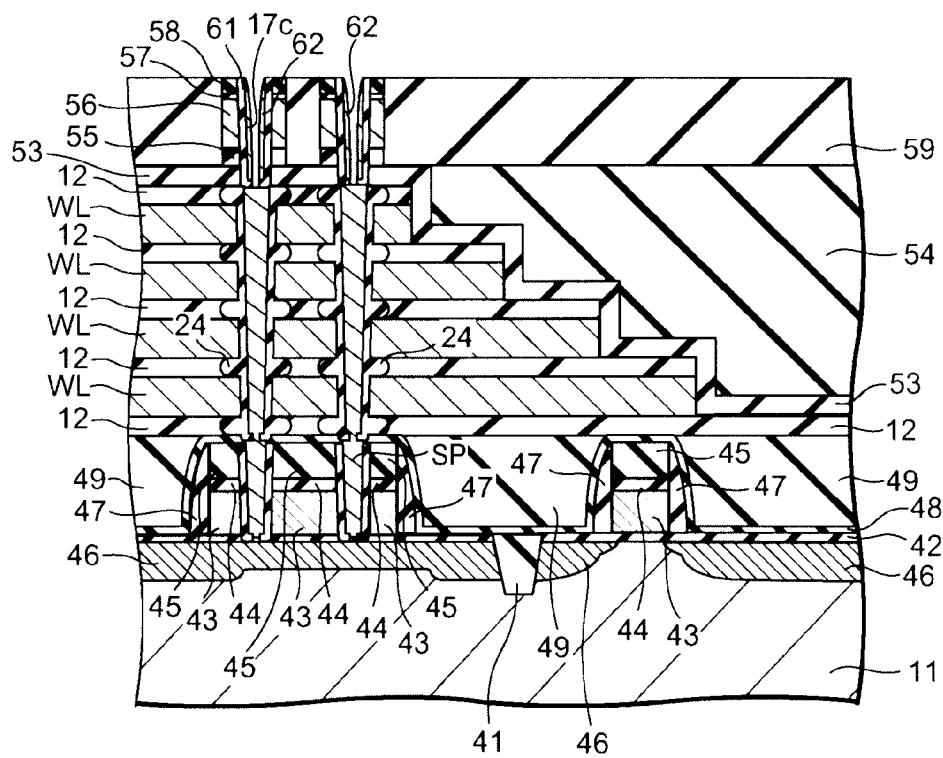

Then, as illustrated in FIG. 17B, RIE is performed to remain the amorphous silicon film 62 only on a side face of the through-hole 17c and pattern the amorphous silicon film 62 into a spacer configuration. Etching is performed using the amorphous silicon film 62 as a mask to remove the gate insulation film 61 from a bottom face of the through-hole 17c. Thereby, the central portion of the silicon pillar SP is exposed at the bottom face of the through-hole 17c.

Figure 18A:
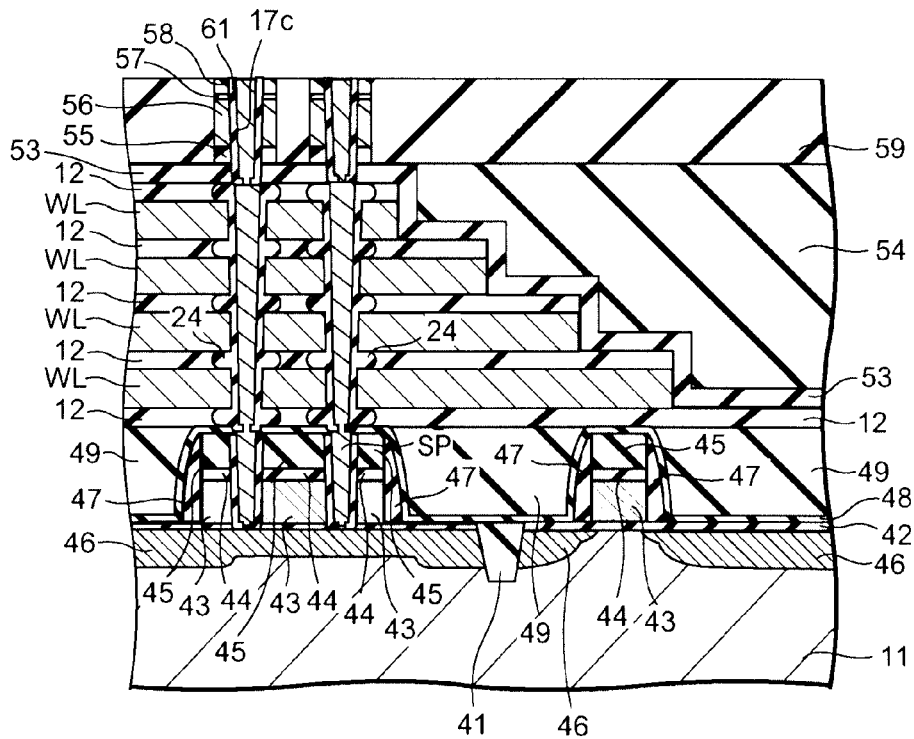
FIGS. 18A and 18B are cross-sectional views of steps, illustrating the method for manufacturing the nonvolatile semiconductor memory device according to the fourth embodiment.

Continuing as illustrated in FIG. 18A, amorphous silicon is deposited and flattened. An upper portion of the silicon pillar SP is thereby filled into an interior of the through-hole 17c. Channel ion implantation is then performed on the upper portion of the silicon pillar SP. A drain diffusion layer (not illustrated) is formed. RTA is then performed to activate the implanted impurities. An upper portion select transistor is thereby formed. At this time, the poly silicon film 56 forms the upper select gate USG.

Figure 18B:
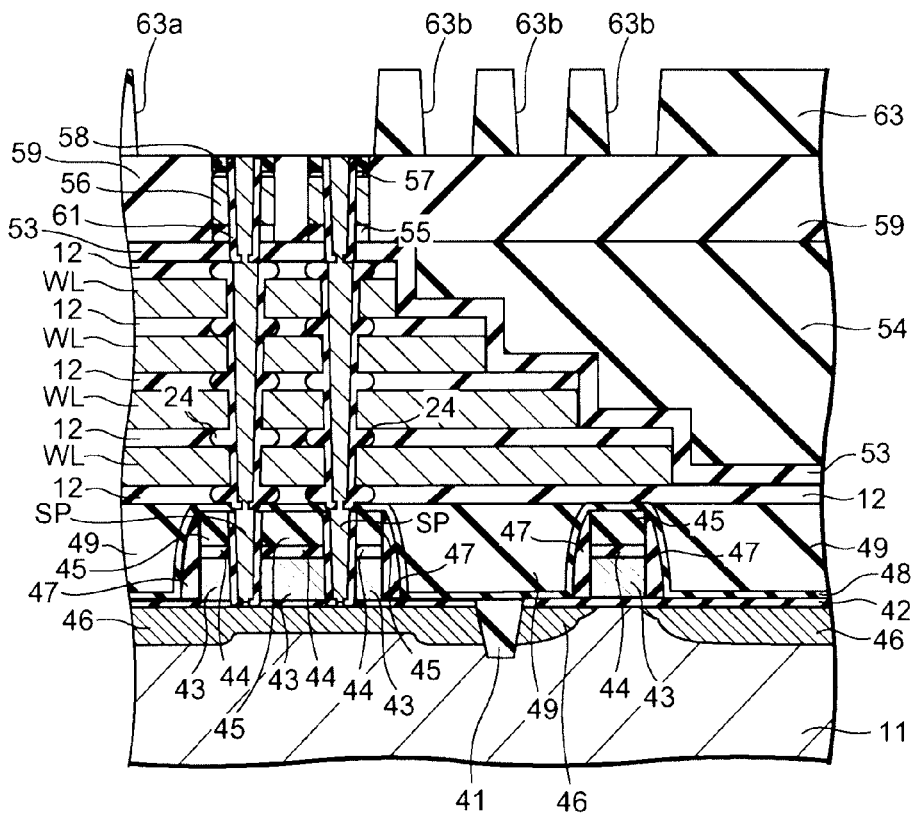

As illustrated in FIG. 18B, an inter-layer insulating film 63 is then formed on the inter-layer insulating film 59. An aperture 63a for forming the bit line BL is formed in the inter-layer insulating film 63 in a region including regions directly above the silicon pillars SP (referring to FIG. 1). Apertures 63b for forming contact holes are also formed in the inter-layer insulating film 63. At this time, each aperture 63b is formed in a region directly above a portion which is an end portion of one electrode film WL that has none of the other electrode films WL or the upper select gate USG provided in a region directly thereabove.

Figure 19A:
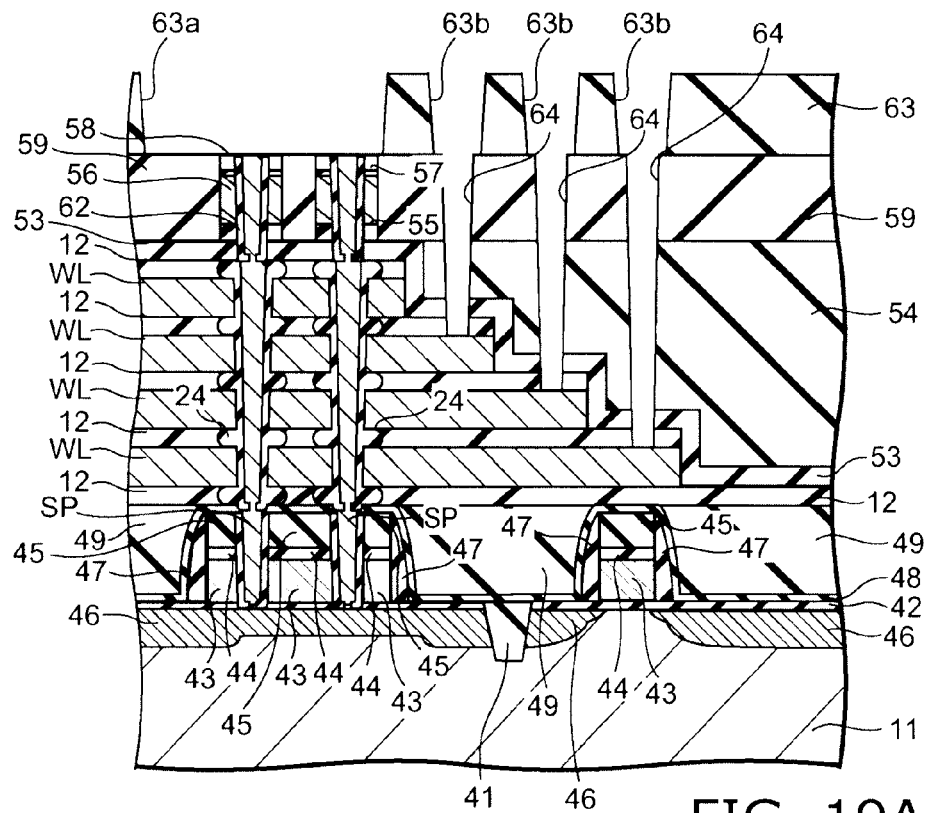
FIGS. 19A and 19B are cross-sectional views of steps, illustrating the method for manufacturing the nonvolatile semiconductor memory device according to the fourth embodiment.

Then, as illustrated in FIG. 19A, the inter-layer insulating film 59, the inter-layer insulating film 49, and the stopper silicon nitride film 53 are selectively removed from bottom portions of the apertures 63b of the inter-layer insulating film 63 to form a plurality of contact holes 64. At this time, each contact hole 64 reaches an end portion of each electrode film WL.

Figure 19B:
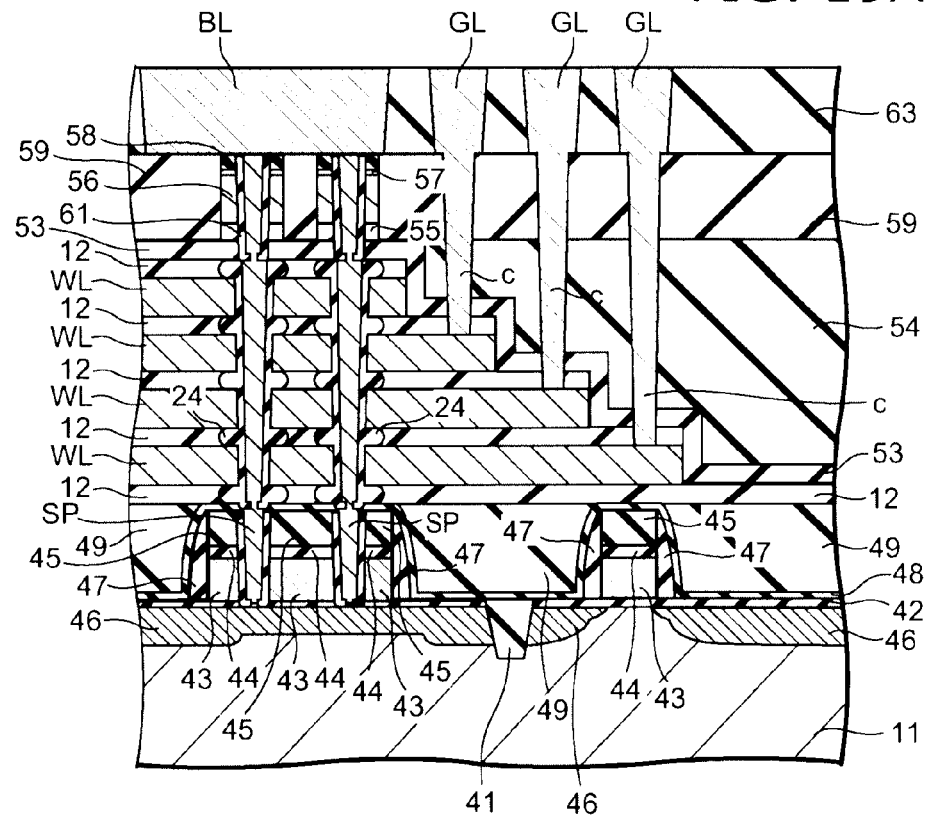

Continuing as illustrated in FIG. 19B, a metal is filled into the aperture 63a, the apertures 63b, and the contact holes 64 and then flattened. Thereby, the bit line BL is formed in the aperture 63a, gate lines GL are formed in the apertures 63b, and contacts C are formed in the contact holes 64. The nonvolatile semiconductor memory device is thereby manufactured. The structure of the gap 18, the interior thereof, and the peripheral portion thereof of the nonvolatile semiconductor memory device thus manufactured is similar to that of the nonvolatile semiconductor memory device 1 according to the first embodiment described above.

According to this embodiment, the gaps 18 between the electrode films WL can be formed by wet-etching the insulating films 12 via the through-hole 17b in the step illustrated in FIG. 12B described above. The charge storage layer 26 can be formed along the inner faces of the gaps 18 to detour around the shortest path by forming the charge storage layer 26 in the step illustrated in FIG. 13B. Thereby, electrons accumulated in the portion 26a of the charge storage layer 26 corresponding to one electrode film WL can be prevented from diffusing into a portion 26a corresponding to another electrode film WL; and the reliability of the retained data can be improved. In this case, the block layer 25 and the charge storage layer 26 are formed to satisfy Formula (2) recited above. Thereby, the charge storage layer 26 can be reliably curved along the inner face of the gap 18. Further, the tunnel insulation layer 27 is formed to satisfy Formula (3) recited above. The silicon pillar SP is thereby prevented from entering the gap 18. Thereby, the electrons of the charge storage layer 26 can be prevented from accumulating in the portions 26b between the electrode films WL.

In addition, adjacent through-holes 17b can be formed to connect with each other via the gaps 18 by increasing the etching amount of the insulating film 12 in the step illustrated in FIG. 12B. Therefore, a device can be manufactured including the structure of the gap 18, the interior thereof, and the peripheral portion thereof similar to that of the nonvolatile semiconductor memory device 2 according to the second embodiment described above.

Moreover, during the patterning of the upper stacked gate body, which is formed of the silicon oxide film 55, the poly silicon film 56, the TEOS film 57, and the silicon nitride film 58, into the line configuration in the step illustrated in FIG. 16A, the stacked memory body and the lower stacked gate body provided below the upper stacked gate body can be simultaneously patterned into a line configuration to divide the stacked body ML. And then the insulating film 31 can be filled between the divided stacked body ML. Therefore, a device can be manufactured including the structure of the stacked memory body similar to that of the nonvolatile semiconductor memory device 3 according to the third embodiment described above.

At this time, the stacked body ML can be easily patterned by controlling the etching amount of the insulating film 12 in the step illustrated in FIG. 12B such that the ONO film 24 does not extend into the fashioning region of the stacked body ML.

Hereinabove, the present invention is described with reference to the embodiments. However, the present invention is not limited to these embodiments. For example, all additions, deletions, or design modifications of components or additions, omissions, or condition modifications of steps appropriately made by one skilled in the art in regard to the embodiments described above are within the scope of the present invention to the extent that the purport of the present invention is included.

The invention claimed is:

1. A nonvolatile semiconductor memory device comprising:
   a stacked body in which a plurality of insulating films and a plurality of electrode films are alternately stacked and a through-hole is formed to extend in the stacking direction;
   a semiconductor pillar filled into the through-hole;
   a charge storage layer provided between the electrode film and the semiconductor pillar;
   an insulative block layer provided between the electrode film and the charge storage layer; and
   an insulative tunnel insulation layer provided between the semiconductor pillar and the charge storage layer,
   a gap being formed between the electrode films to connect with the through-hole,
   the charge storage layer being formed along an inner face of the gap, and
   the formula $$(tb+tc) \times 2 < S < (tb+tc+tt) \times 2 \qquad (1)$$

being satisfied, where
   S is a distance between the electrode films,
   tb is a thickness of the block layer,
   tc is a thickness of a charge storage layer, and
   tt is a thickness of the tunnel insulation layer.

2. The device according to claim 1, further comprising an insulative tunnel insulation layer provided between the semiconductor pillar and the charge storage layer, the tunnel insulation layer filling the gap.

3. The device according to claim 1, wherein the gap connecting with the through-hole does not connect with another through-hole.

4. The device according to claim 3, wherein a configuration of the gap is a circular ring configuration to enclose the through-hole.

5. The device according to claim 3, further comprising an insulative block layer provided between the electrode film and the charge storage layer,
   the block layer being formed along an inner face of the gap and curved in a recessed configuration as viewed from a central axis of the through-hole.

6. The device according to claim 3, further comprising a tunnel insulation layer provided between the charge storage layer and the semiconductor pillar,
   a portion of the tunnel insulation layer between the semiconductor pillar and one of the plurality of insulating films being thicker than a portion of the tunnel insulation layer between the semiconductor pillar and one of the plurality of electrode films.

7. The device according to claim 1, wherein a second through-hole is formed in the stacked body to extend in the stacking direction, and the gap connects to the through-hole and to the second through-hole.

8. The device according to claim 7, further comprising an insulative block layer provided between the electrode film and the charge storage layer,
   the block layer and the charge storage layer being formed along an upper face and a lower face of the gap.

9. The device according to claim 1, further comprising a second insulating film that divides the stacked body in one direction orthogonal to the stacking direction,
   the gap not reaching the second insulating film.

* * * * *